US007554100B2

(12) United States Patent
Fudeta

(10) Patent No.: US 7,554,100 B2
(45) Date of Patent: Jun. 30, 2009

(54) FABRICATING METHOD OF SEMICONDUCTOR LIGHT-EMITTING DEVICE

(75) Inventor: Mayuko Fudeta, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 371 days.

(21) Appl. No.: 11/510,065

(22) Filed: Aug. 24, 2006

(65) Prior Publication Data
US 2007/0045563 A1 Mar. 1, 2007

(30) Foreign Application Priority Data
Aug. 25, 2005 (JP) ............................ 2005-243671
Jun. 2, 2006 (JP) ............................ 2006-154824

(51) Int. Cl.
*F21V 9/16* (2006.01)
(52) U.S. Cl. ................. 250/458.1; 250/459.1; 324/765; 324/767
(58) Field of Classification Search ............. 250/458.1, 250/459.1; 438/16; 324/765, 767
See application file for complete search history.

(56) References Cited
U.S. PATENT DOCUMENTS
5,541,416 A * 7/1996 Washizuka ............... 250/458.1
6,362,016 B1 * 3/2002 Funato et al. ............... 438/46
6,373,069 B1 * 4/2002 Akaike et al. ............. 250/459.1
2004/0156419 A1 * 8/2004 Kleinerman ............... 374/120
2005/0054127 A1 * 3/2005 Toda ........................... 438/16

FOREIGN PATENT DOCUMENTS
JP 07-050331 A 2/1995
JP 09-167791 A 6/1997

* cited by examiner

*Primary Examiner*—David Vu
*Assistant Examiner*—Brandon Fox
(74) *Attorney, Agent, or Firm*—Morrison & Foerster LLP

(57) ABSTRACT

A fabricating method of a semiconductor light-emitting device includes the step of forming a wafer including a multi-layered semiconductor film epitaxially grown on a base substrate and containing an active layer, the step of performing pass/fail judgment of the active layer by photo-exciting the active layer in the wafer and by measuring emission intensity from the active layer at least at two temperature points, and the step of forming a light-emitting device structure with the multi-layered semiconductor film containing the active layer judged to be of good quality in the pass/fail judgment.

7 Claims, 6 Drawing Sheets

FABRICATING METHOD OF SEMICONDUCTOR LIGHT-EMITTING DEVICE

This nonprovisional application is based on Japanese Patent Applications Nos. 2005-243671 and 2006-154824 filed with the Japan Patent Office on Aug. 25, 2005 and Jun. 2, 2006, respectively, the entire contents of which are hereby incorporated by reference.

BACKGROUND OF THE INVENTION

1. Field of the Invention

The present invention relates to a fabricating method of a semiconductor light-emitting device, and more particularly to a fabricating method capable of efficiently providing a semiconductor light-emitting device having performance higher than a prescribed standard at low costs.

2. Description of the Background Art

In Japanese Patent Laying-Open No. 07-050331, a wafer includes a multi-layered semiconductor film epitaxially grown on a substrate and containing an active layer (light-emitting layer), and then an optical pulse is injected from a surface of the wafer into the active layer. An attenuation time of light emission from the active layer excited by the optical pulse is measured to determine a lifetime of minor carriers which dominantly influences luminous efficiency, in order to evaluate the luminous efficiency of light-emitting devices formed from the wafer.

In the case of a light-emitting device including a multi-layered semiconductor film made of a plurality of nitride-based compound semiconductor layers, for example, it is likely that piezoelectric field is generated in the active layer due to large internal strain in the multi-layered semiconductor film. In such a case, the energy band in the active layer suffers bending, which influences and changes the lifetime of the minor carriers. As such, the luminous efficiency cannot precisely be evaluated by using the method disclosed in Japanese Patent Laying-Open No. 07-050331.

SUMMARY OF THE INVENTION

In view of the foregoing, an object of the present invention is to provide a method with which a semiconductor light-emitting device having performance higher than a prescribed standard can efficiently be fabricated at low costs.

A fabricating method of a semiconductor light-emitting device according to the present invention includes the steps of forming a wafer including a multi-layered semiconductor film epitaxially grown on a base substrate and containing an active layer; performing pass/fail judgment of the active layer by photo-exciting the active layer in the wafer and then measuring intensity of light emission from the active layer at least at two temperature points; and forming a light-emitting device structure with the multi-layered semiconductor film containing the active layer judged to be of good quality in the pass/fail judgment.

The step of performing pass/fail judgment of the active layer may be carried out before or during the step of forming the light-emitting device structure. It is preferable that light of a wavelength that can selectively excite the active layer is used for the photo-excitation. Further, it is preferable that among the at least two temperature points, the lowest temperature point is in a range of lower than 150K and the highest temperature point is in a range of higher than 230 K and lower than 550 K. Density of carriers generated in the active layer by the photo-excitation is preferably in a range of more than 1/100 and less than 100 times a carrier density in the semiconductor light-emitting device that is under a condition of being injected with a rated current density. The pass/fail judgment of the active layer can be carried out based on whether a ratio of the emission intensity at a temperature point of higher than 230 K and lower than 550 K to that at a temperature point of lower than 150 K is greater than a prescribed reference value.

The step of forming the light-emitting device structure may include the step of bonding the wafer to a support substrate, and the step of performing pass/fail judgment of the active layer may be carried out after the bonding step. The step of forming the light-emitting device structure may include the step of removing the base substrate, and the step of performing pass/fail judgment of the active layer may be carried out after the removing step.

A semiconductor light-emitting device fabricated by the above-described method may include a layer of nitride-based compound semiconductor ($In_xAl_yGa_{1-x-y}N$: $0 \leq x$, $0 \leq y$, $x+y<1$) in the multi-layered semiconductor film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

As described above, when emission intensity caused by photo-excitation in an active layer is measured at least at two temperature points, luminous efficiency of the active layer can precisely be evaluated for pass/fail judgment of the active layer.

The luminous efficiency measured herein is so-called internal quantum efficiency of the active layer. The internal quantum efficiency means the ratio of electric current that is converted into light to the total current injected into the active layer. When the epitaxial growth conditions for the multi-layered semiconductor film vary and then the crystal quality varies, the internal quantum efficiency of the active layer also varies.

It is known that the internal quantum efficiency is 100% at a low temperature. This means that the ratio of the emission intensity of the active layer at a room temperature to that at the low temperature indicates the internal quantum efficiency at the room temperature. In the method of the present invention, the internal quantum efficiency of the active layer can precisely be measured, since it is not affected by bending of the energy band due to the piezoelectric field in the multi-layered semiconductor film. According to the present invention, therefore, it is possible to provide a method that can efficiently fabricate a light-emitting device having performance higher than a prescribed standard at low costs.

First Embodiment

Figure 1:
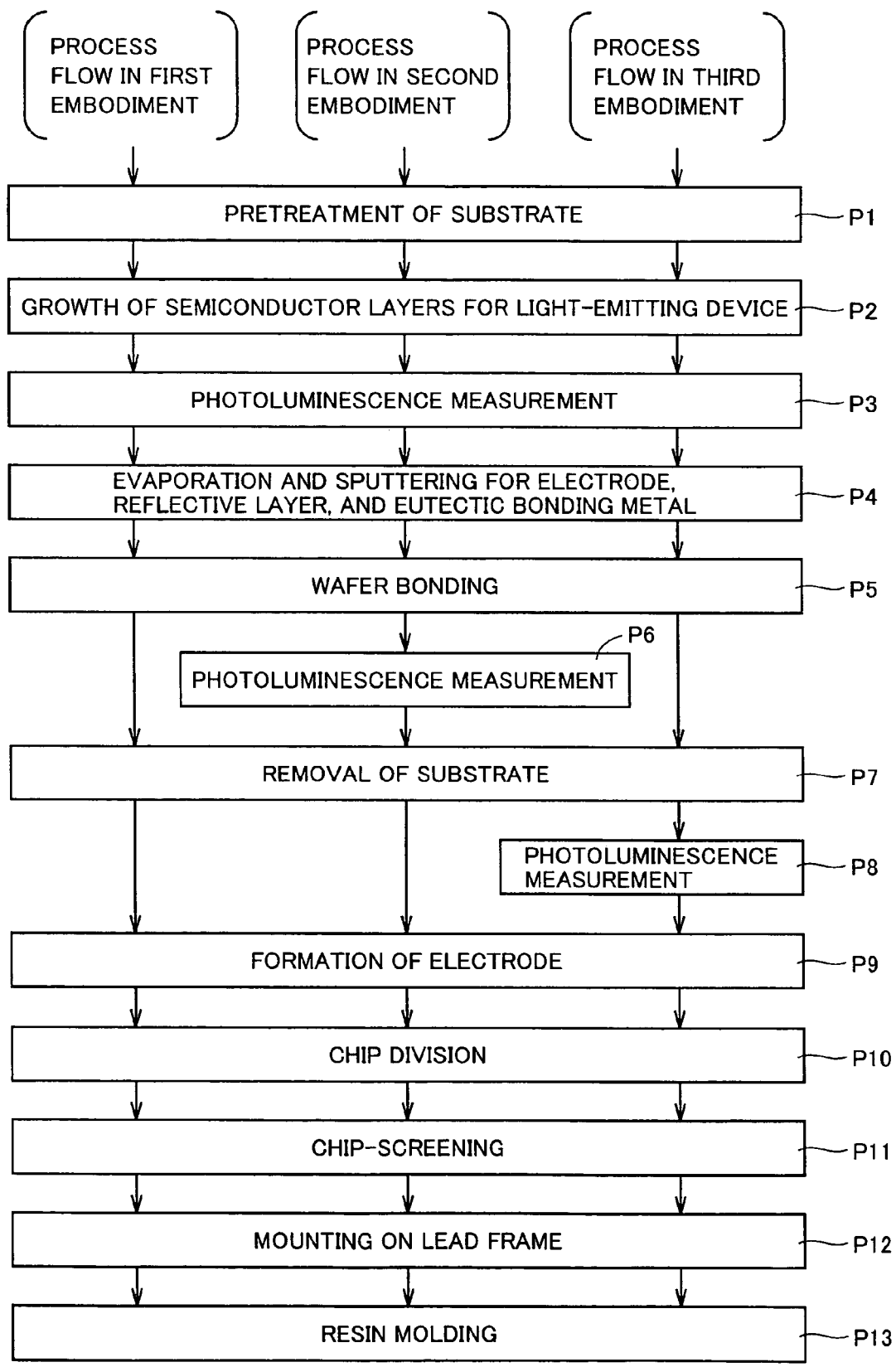
FIG. 1 is a flowchart illustrating steps in a fabricating method of a light-emitting device according to first through third embodiments of the present invention.

A flowchart in FIG. 1 shows steps in the fabricating method of a nitride-based semiconductor light-emitting device according to a first embodiment of the present invention.

In the first embodiment, firstly in a step P1, a sapphire substrate (base substrate) is subjected to pretreatment using an acid, though this pretreatment of the substrate may be omitted.

Figure 2:
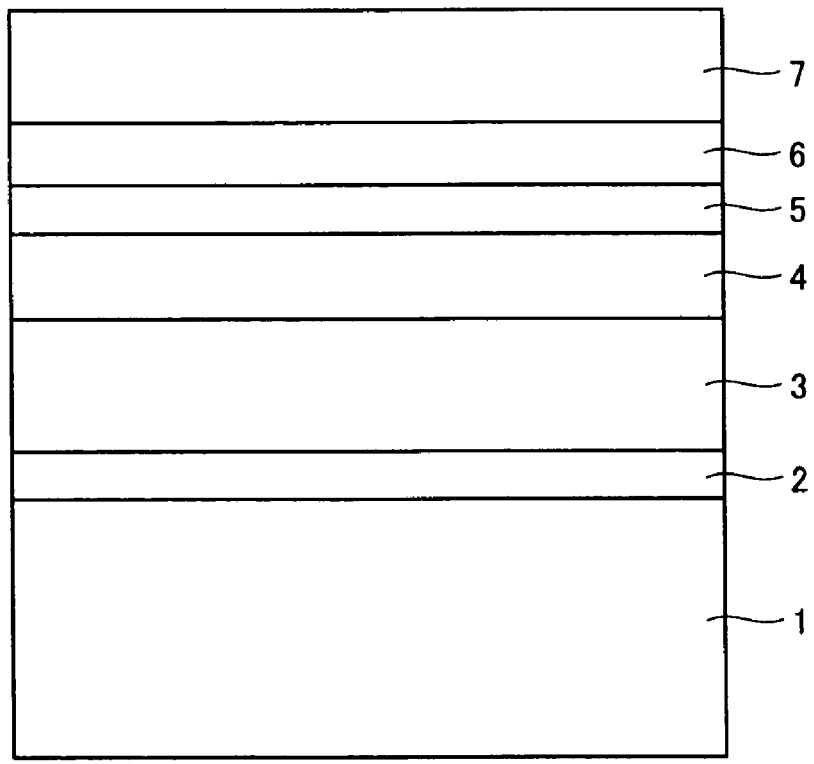
FIG. 2 is a schematic cross sectional view showing a wafer including a multi-layered semiconductor film which is formed on a sapphire substrate (base substrate) and contains an active layer.

In a step P2, as shown in a schematic cross sectional view of FIG. 2, a multi-layered semiconductor film including a plurality of semiconductor layers 2-7 is formed on a sapphire substrate 1 by MOCVD (metallorganic chemical vapor deposition) (light-emitting device growth step). At this time, sapphire substrate 1 is initially introduced into a reaction chamber of a MOCVD apparatus. Substrate 1 is heated to 1100° C. in a hydrogen atmosphere and held at the same temperature for several minutes for cleaning thereof.

Thereafter, the substrate temperature is decreased to 1050° C., and $NH_3$ is introduced into the reaction chamber. Subsequently, TMG (trimethyl gallium) and TMA (trimethyl aluminum) are introduced into the reaction chamber to grow an AlGaN layer 2 to about 0.2 µm thickness. Next, $SiH_4$ is let flow into the reaction chamber for several minutes, and an n-type GaN layer 3 is grown to about 5 µm thickness.

Thereafter, the substrate temperature is lowered to 900° C., and ten InGaN layers and ten GaN layers are grown alternately to constitute a strain relaxation layer 4. The band gap of the InGaN layers at this time is set greater than that of a light-emitting layer (active layer) 5.

Next, the substrate temperature is lowered to 780° C., and three InGaN layers and three GaN layers are grown alternately to constitute a MQW (multi-quantum well) light-emitting layer 5. In this MQW, the three InGaN layers (well layers) are made to be about 6 nm thick in total. Here, emission wavelength of light-emitting layer 5 was set to be 450 nm.

Next, the substrate temperature is increased to 980° C., and a p-type AlGaN layer 6 is grown to about 20 nm thickness and then a p-type GaN layer 7 is grown to about 100 nm thickness. Thereafter, $N_2$ and $NH_3$ alone are let flow as a gaseous atmosphere in the reaction chamber, while the substrate is cooled to a room temperature. At this time, the $NH_3$ concentration is set to be about 0.2%. The light-emitting device growth step P2 is thus completed.

In a step P3, the wafer taken out of the MOCVD apparatus in step P2 is introduced into a cryostat in order to perform photoluminescence measurement to determine the internal quantum efficiency of light-emitting layer 5. As a photoluminescence measurement apparatus, it is possible to use such an apparatus as shown in the schematic block diagram in FIG. 9, for example.

Figure 9:
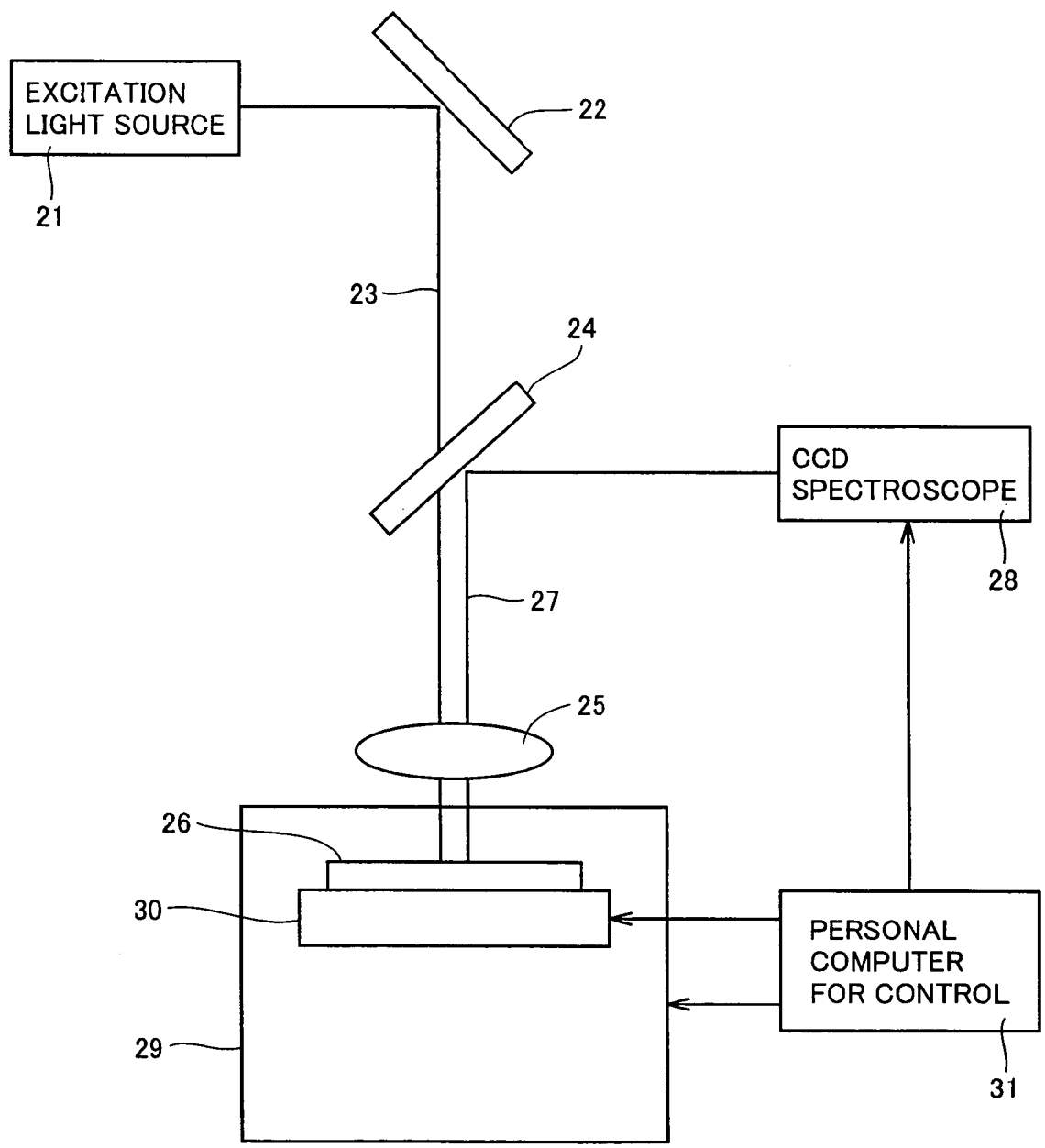
FIG. 9 is a schematic block diagram showing an example of a photoluminescence measurement apparatus.

In the first embodiment, a laser device that emits light of 405 nm wavelength is used for an excitation light source 21 shown in FIG. 9. For this laser device 21, for example, it is possible to use a semiconductor laser or the second harmonic component of a solid-state laser. It is also possible to spectroscopically split a white light source and then use only light near 405 nm wavelength. When the excitation light of 405 nm wavelength is used, the light-emitting layer can selectively be excited without excitation of the semiconductor layers other than the light-emitting layer. This enables accurate evaluation of the internal quantum efficiency of the light-emitting layer without influence of the other semiconductor layers. It is noted that when a white light source is used for excitation light source 21, a spectroscope may be inserted between the white light source and a mirror 22.

The carrier density caused by photo-excitation in the light-emitting layer is set to be preferably in a range of more than 1/100 and less than 100 times, and more preferably approximately equal to, the carrier density in the light-emitting device that is under condition of being injected with a rated current density. In the first embodiment, power of the laser light of 405 nm wavelength was set to be 10 mW on the wafer surface, and the converged light spot size of the laser light on the wafer surface was set to be about 25 µm. That is, an excitation light ray 23 emitted from light source 21 and reflected by mirror 22 passes through a half mirror 24 and is converged onto an epitaxial wafer 26 by a lens 25. Provided that the light absorption coefficient of InGaN is about $1 \times 10^5/$cm for light of 405 nm wavelength, if all photons absorbed by the quantum well layers of 6 nm total thickness in the light-emitting layer generate carriers, a carrier density similar as in the case that a rated current of 20 mA is let flow through the light-emitting diode can be caused in the light-emitting layer.

Light emission 27 caused by photo-excitation of the light-emitting layer included within epitaxial wafer 26 is detected by a CCD (charge coupled device) spectroscope 28 via lens 25 and half mirror 24, and its emission intensity is measured.

In FIG. 9, CCD spectroscope 28, a cryostat 29 and an electromotive stage 30 are controlled by a personal computer 31. Cryostat 29 is sufficiently evacuated before cooling and then cooled to about 20 K.

Figure 5:
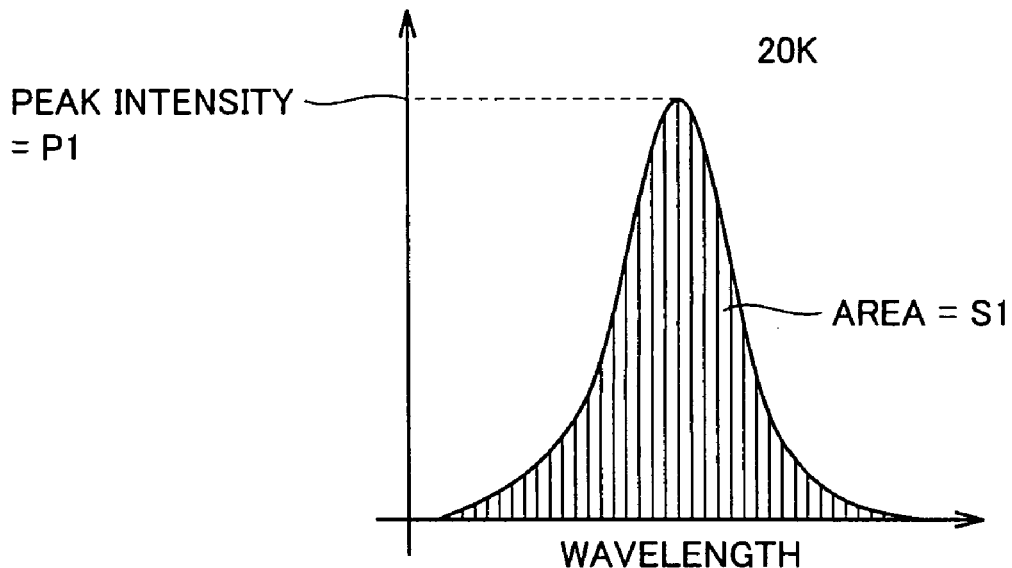
FIG. 5 is a graph showing an emission spectrum as a result of photoluminescence measurement of a light-emitting layer at a low temperature.

A schematic graph in FIG. 5 shows an emission spectrum of the light-emitting layer measured at 20 K. In the graph of FIG. 5, a horizontal axis represents the emission wavelength, and a vertical axis represents the emission intensity.

Next, the set temperature of cryostat 29 is changed to 300 K. When the temperature of cryostat 29 becomes stable at 300 K, the conditions other than the temperature are set to be the same as those in the case of measurement at 20 K and then emission intensity from the light-emitting layer is measured.

Figure 6:
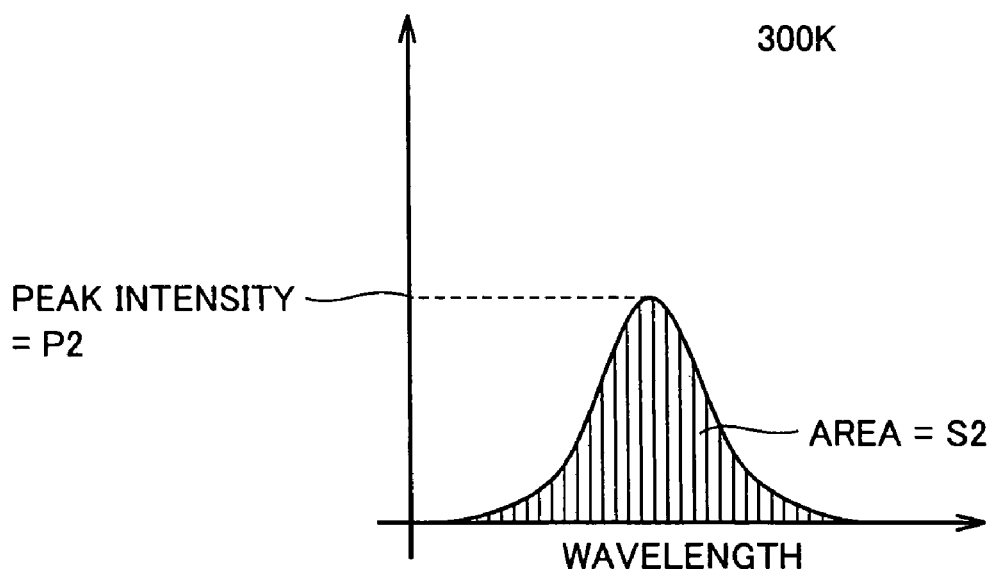
FIG. 6 is a graph showing an emission spectrum as a result of photoluminescence measurement of a light-emitting layer at a room temperature.

A schematic graph in FIG. 6 shows an emission spectrum of the light-emitting layer measured at 300 K. In the graph of FIG. 6 as well, a horizontal axis represents the emission wavelength, and a vertical axis represents the emission intensity.

When the temperature is changed to 300 K, there may be a case where the position of wafer 26 is moved due to thermal expansion of electromotive stage 30, depending on performance of cryostat 29, in which case measurement at the same position as in the case of measurement at 20 K cannot be ensured. In such a case, a reference point may be provided in the wafer, and the position can be designated with X and Y coordinates from the reference point to enable measurement at exactly the same position. Further, there may be a case where wafer 26 moves in a direction deviated away from the focus of lens 25. In such a case, focusing may be adjusted such that the emission intensity becomes a maximum after stabilization of the temperature. This can ensure measurement of emission intensity at exactly the same position. The emission intensities due to photo-excitation in the light-emitting layer can thus be measured at the temperatures of 20 K and 300 K under the same conditions, and the internal quantum efficiency can be determined from the ratio of the intensities.

It is noted that the internal quantum efficiency may be determined as a ratio of an integrated area S2 of spectral distribution in FIG. 6 to an integrated area S1 of spectral distribution in FIG. 5. That is, the internal quantum efficiency=S2/S1. As an easier way, the internal quantum efficiency may be determined as a ratio of the peak intensity P2 of the spectral distribution in FIG. 6 to the peak intensity P1 of the spectral distribution in FIG. 5. That is, the internal quantum efficiency=P2/P1. Any wafer in which the internal quantum efficiency thus determined is more than 50% is judged to have good quality, which is then advanced to subsequent steps so as to be processed into light-emitting devices. More specifically, the wafer judged to be a good product is subjected to a step P4.

It is noted that a photo-diode may be used instead of CCD spectroscope 28 for measuring the emission intensity. In this case, although the spectral distribution and peak wavelength cannot be measured, it is possible to easily measure the emission intensity in total over each entire spectrum (i.e., each of areas S1 and S2 of the spectral distributions).

Figure 3:
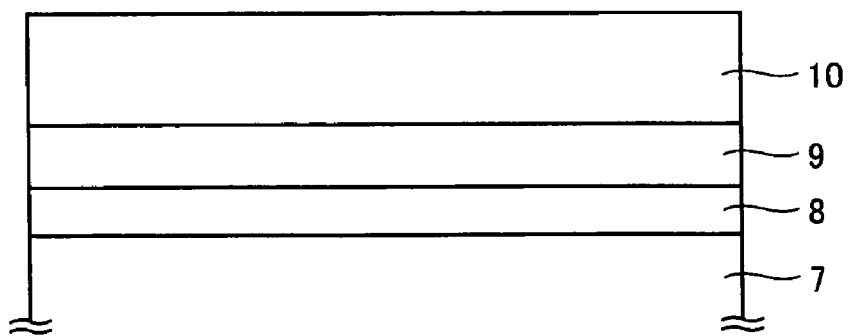
FIG. 3 is a schematic cross sectional view showing a plurality of metal or alloy layers formed on the multi-layered semiconductor film shown in FIG. 2.

In step P4, as shown in a schematic cross sectional view of FIG. 3, a Pd electrode 8 is formed by evaporation on p-type GaN layer 7 shown in FIG. 2, and then a highly reflective AgNd electrode 9 is formed by evaporation. These electrodes are sintered by heat treatment, and then a metallic bonding layer 10 of a eutectic AuSn is formed by evaporation.

Figure 4:
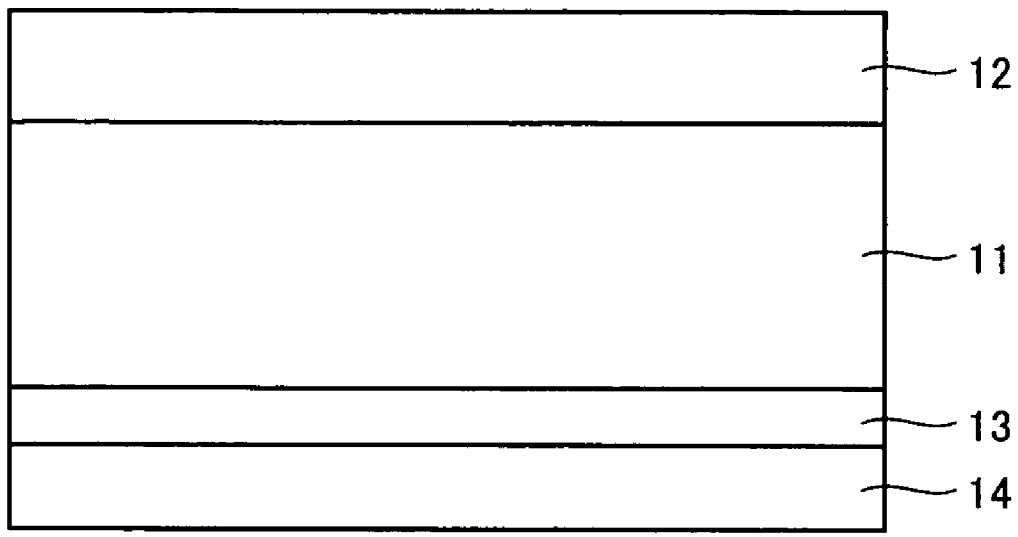
FIG. 4 is a schematic cross sectional view showing a plurality of metal layers formed on both main surfaces of a Si substrate (support substrate).

Next, in a wafer bonding step P5, as shown in the schematic cross sectional view of FIG. 4, an Si substrate (support substrate) 11 is prepared, and an Au layer 12 for eutectic bonding is formed by evaporation on one main surface, and a Ti layer 13 and an Al layer 14 are laminated by evaporation on the other main surface. Next, AuSn layer 10 on sapphire substrate 1 and Au layer 12 on Si substrate 11 are contacted face to face, which are then introduced into a wafer bonding apparatus and heated to the eutectic temperature of AuSn to perform wafer bonding. Next, in a substrate removal step P7, laser light is applied from the sapphire substrate side to remove sapphire substrate 1 and expose n-type semiconductor layer 3. The exposed surface of semiconductor layer 3 is subjected to dry etching to intentionally form an uneven texture on the surface. Next, in an electrode formation step P9, an electrode is formed on n-type semiconductor layer 3. In a chip division step P10, laser scribing is used in chip division for each light-emitting device.

Next, in a chip-screening step P11, chip-screening is carried out with a chip-screening machine. In chip-screening, electric current is injected into each chip by probing in order to measure luminance of the chip. Chips are screened depending on their measured luminance and electric properties, and defective products are eliminated. Next, the chip judged to be of good quality is mounted to a lead frame (step P12) and subjected to resin molding (step P13).

Figure 7:
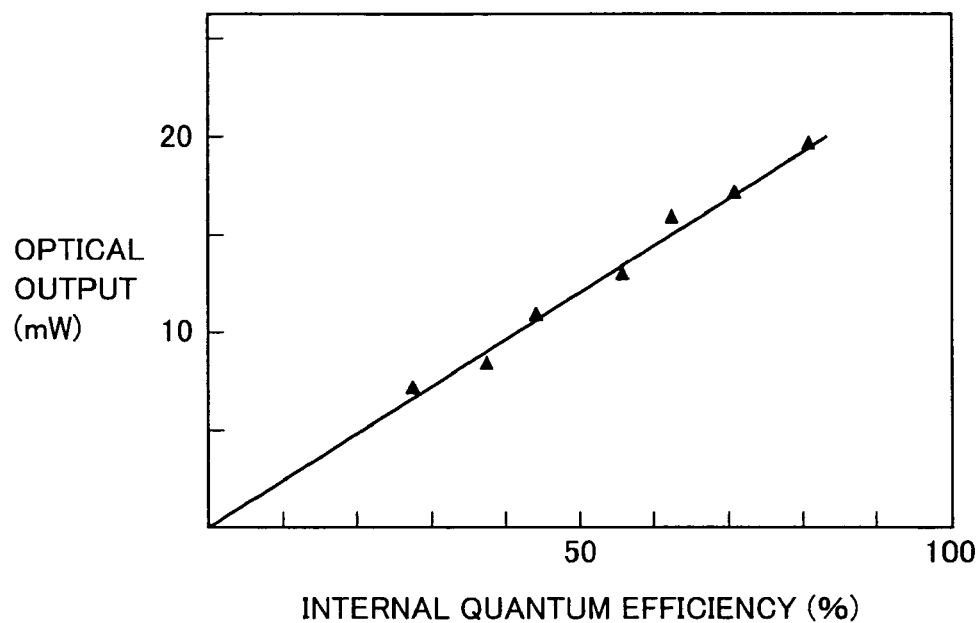
FIG. 7 is a graph showing the relation between the measured internal quantum efficiency of the light-emitting layer and the optical output of the light-emitting device in the first embodiment.

The relation between the optical output and the internal quantum efficiency was investigated in the light-emitting devices fabricated as above and it has been found that there is a very good interrelation therebetween, as shown in a graph of FIG. 7. In the graph of FIG. 7, a horizontal axis represents the internal quantum efficiency (%), and a vertical axis represents the optical output (mW).

When the internal quantum efficiency was evaluated at the time point when the crystal growth of the multi-layered semiconductor film was finished and only the wafers judged to be of good quality were advanced to the subsequent steps as described above, the fabrication time per chip was reduced by about 20% compared to the case of not conducting the evaluation step. This means that the fabricating method of the present invention can contribute to improvement in productivity as well as cost cutting of the light-emitting device.

Figure 8:
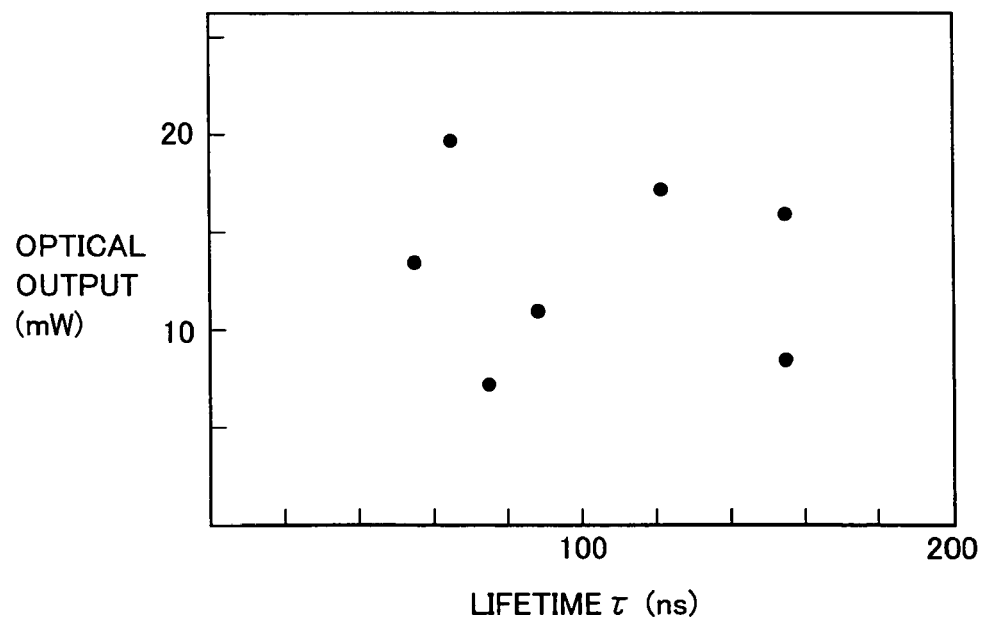
FIG. 8 is a graph showing the relation between the measured lifetime of carriers in the light-emitting layer of the first embodiment determined by a conventional measurement method and the optical output of the light-emitting device.

When the relation between the optical output and the results measured by using the method of Japanese Patent Laying-Open No. 07-050331 was investigated, no correlation was recognized therebetween, as shown in a graph of FIG. 8. This means that the method of the prior art cannot be used as an appropriate inspection method. Here, in the graph of FIG. 8, a horizontal axis represents the lifetime $\tau$ (ns) of carriers, and a vertical axis represents the optical output (mW).

Second Embodiment

The steps in the fabricating method according to a second embodiment of the present invention are also shown in the flowchart in FIG. 1. The fabricating method of the second embodiment is generally similar to that of the first embodiment, except for the following points.

The second embodiment differs from the first embodiment only in that a photoluminescence measurement step P6 is additionally carried out after wafer bonding step P5, for pass/fail judgment of the active layer. This is done for the purpose of checking whether there was caused no damage to the active layer in wafer bonding step P5. The method for the pass/fail judgment is identical to that of the first embodiment. Any product of which internal quantum efficiency is more than 50% is advanced to the subsequent steps. In the second embodiment, the fabrication time per chip was reduced by about 15% compared to the case of not conducting the pass/fail judgment steps. In this manner, it was possible to improve the productivity and cut the costs in the second embodiment as well.

Although the internal quantum efficiency is checked twice in steps P3 and P6 in the second embodiment, step P3 may be omitted. In such a case, although the steps up to step P5 are carried out for all the wafers including defective ones, the inspection time in step P3 is unnecessary and thus the chip fabrication time may be reduced as a whole.

Third Embodiment

The steps in the fabricating method according to a third embodiment of the present invention are also shown in the flowchart in FIG. 1. The fabricating method of the third embodiment is again generally similar to that of the first embodiment, except for the following points.

The third embodiment differs from the first embodiment only in that a photoluminescence measurement step P8 is additionally carried out after substrate peeling step P7, for pass/fail judgment of the active layer. This is done for the purpose of checking whether there was caused no damage to the active layer in substrate removal step P7. The method for the pass/fail judgment is identical to that in the first embodiment. Any product of which internal quantum efficiency is more than 50% is judged to be of good quality and advanced to the subsequent steps. In the third embodiment, the fabrication time per chip was reduced by about 10% compared to the case of not conducting the pass/fail judgment step. Accordingly, it was possible to improve the productivity and cut the costs in the third embodiment as well.

Although the internal quantum efficiency is checked twice in steps P3 and P8 in the third embodiment, step P3 may be omitted. In such a case, although the steps up to step P7 are carried out for the wafers including defective ones, the inspection time in step P3 is unnecessary and thus the chip fabrication time may be reduced as a whole.

As described above, according to the present invention, it is possible to provide a method that can efficiently fabricate a light-emitting device having performance higher than a prescribed standard at low costs.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A fabricating method of a semiconductor light-emitting device, comprising the steps of:
    forming a wafer including a multi-layered semiconductor film epitaxially grown on a base substrate and containing an active layer;
    performing pass/fail judgment of said active layer by photo-exciting said active layer in said wafer and by measuring emission intensity from the active layer at least at two temperature points; and
    forming a light-emitting device structure with said multi-layered semiconductor film containing said active layer judged to be of good quality in said pass/fail judgment.

2. The fabricating method of a semiconductor light-emitting device according to claim 1, wherein said step of performing pass/fail judgment of said active layer is carried out before or during said step of forming the light-emitting device structure.

3. The fabricating method of a semiconductor light-emitting device according to claim 1, wherein light of a wavelength that can selectively excite said active layer is used for said photo-excitation.

4. The fabricating method of a semiconductor light-emitting device according to claim 1, wherein among said at least two temperature points, the lowest temperature point is in a range of lower than 150K and the highest temperature point is in a range of higher than 230 K and lower than 550 K.

5. The fabricating method of a semiconductor light-emitting device according to claim 1, wherein a density of carriers caused in said active layer by said photo-excitation is in a range of more than 1/100 and less than 100 times a carrier density of said semiconductor light-emitting device that is under a condition of being injected with a rated current density.

6. The fabricating method of a semiconductor light-emitting device according to claim 1, wherein said pass/fail judgment is carried out based on whether a ratio of said emission intensity at a temperature point of higher than 230 K and lower than 550 K to that at a temperature point of lower than 150 K is greater than a prescribed reference value.

7. A semiconductor light-emitting device fabricated by the method recited in claim 1, wherein said multi-layered semiconductor film contains a layer of nitride-based compound semiconductor ($In_xAl_yGa_{1-x-y}N$: $0 \leqq x$, $0 \leqq y$, $x+y<1$).

* * * * *

UNITED STATES PATENT AND TRADEMARK OFFICE
CERTIFICATE OF CORRECTION

| | | |
|---|---|---|
| PATENT NO. | : 7,554,100 B2 | Page 1 of 1 |
| APPLICATION NO. | : 11/510065 | |
| DATED | : June 30, 2009 | |
| INVENTOR(S) | : Mayuku Fudeta | |

It is certified that error appears in the above-identified patent and that said Letters Patent is hereby corrected as shown below:

Column 8, line 31, insert the following claims:

-- 8. The fabricating method of a semiconductor light-emitting device according to claim 1, wherein said step of forming the light-emitting device structure includes the step of bonding said wafer to a support substrate, and said step of performing pass/fail judgment of the active layer is carried out after the bonding step.

9. The fabricating method of a semiconductor light-emitting device according to claim 1, wherein said step of forming the light-emitting device structure includes the step of removing said base substrate, and said step of performing pass/fail judgment of the active layer is carried out after the removing step. --

Signed and Sealed this

Twenty-second Day of December, 2009

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,554,100 B2 | |
| APPLICATION NO. | : 11/510065 | |
| DATED | : June 30, 2009 | |
| INVENTOR(S) | : Mayuku Fudeta | |

It is certified that error appears in the above-identified patent and that said Letters Patent is hereby corrected as shown below:

Delete the title page and substitute therefore the attached title page showing corrected number of claims.

Delete Columns 1-8 and substitute therefore the attached Columns 1-8 consisting of added claims 8 and 9.

This certificate supersedes the Certificate of Correction issued December 22, 2009.

Signed and Sealed this

Ninth Day of February, 2010

David J. Kappos
*Director of the United States Patent and Trademark Office*

United States Patent
Fudeta

(10) Patent No.: US 7,554,100 B2
(45) Date of Patent: Jun. 30, 2009

(54) FABRICATING METHOD OF SEMICONDUCTOR LIGHT-EMITTING DEVICE

(75) Inventor: Mayuko Fudeta, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 371 days.

(21) Appl. No.: 11/510,065

(22) Filed: Aug. 24, 2006

(65) Prior Publication Data
US 2007/0045563 A1   Mar. 1, 2007

(30) Foreign Application Priority Data
Aug. 25, 2005  (JP)  ............... 2005-243671
Jun. 2, 2006   (JP)  ............... 2006-154824

(51) Int. Cl.
F21V 9/16   (2006.01)

(52) U.S. Cl. ............. 250/458.1; 250/459.1; 324/765; 324/767

(58) Field of Classification Search ............. 250/458.1, 250/459.1; 438/16; 324/765, 767
See application file for complete search history.

(56) References Cited

U.S. PATENT DOCUMENTS

| | | | |
|---|---|---|---|
| 5,541,416 A * | 7/1996 | Washizuka | 250/458.1 |
| 6,362,016 B1 * | 3/2002 | Funato et al. | 438/46 |
| 6,373,069 B1 * | 4/2002 | Akaike et al. | 250/459.1 |
| 2004/0156419 A1 * | 8/2004 | Kleinerman | 374/120 |
| 2005/0054127 A1 * | 3/2005 | Toda | 438/16 |

FOREIGN PATENT DOCUMENTS

| | | |
|---|---|---|
| JP | 07-050331 A | 2/1995 |
| JP | 09-167791 A | 6/1997 |

* cited by examiner

Primary Examiner—David Vu
Assistant Examiner—Brandon Fox
(74) Attorney, Agent, or Firm—Morrison & Foerster LLP

(57) ABSTRACT

A fabricating method of a semiconductor light-emitting device includes the step of forming a wafer including a multi-layered semiconductor film epitaxially grown on a base substrate and containing an active layer, the step of performing pass/fail judgment of the active layer by photo-exciting the active layer in the wafer and by measuring emission intensity from the active layer at least at two temperature points, and the step of forming a light-emitting device structure with the multi-layered semiconductor film containing the active layer judged to be of good quality in the pass/fail judgment.

9 Claims, 6 Drawing Sheets

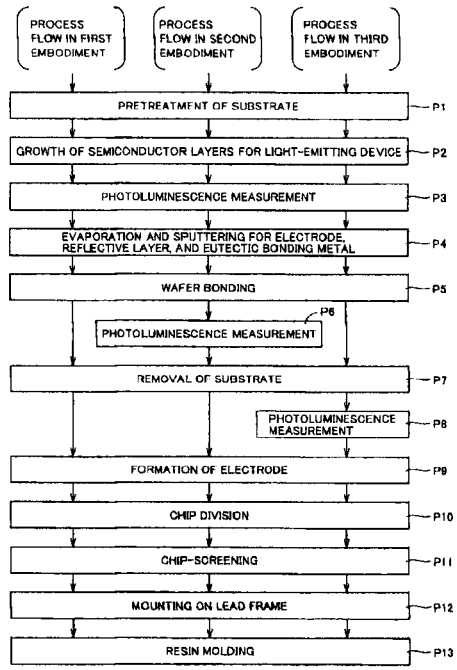

FABRICATING METHOD OF SEMICONDUCTOR LIGHT-EMITTING DEVICE

This nonprovisional application is based on Japanese Patent Applications Nos. 2005-243671 and 2006-154824 filed with the Japan Patent Office on Aug. 25, 2005 and Jun. 2, 2006, respectively, the entire contents of which are hereby incorporated by reference.

BACKGROUND OF THE INVENTION

1. Field of the Invention

The present invention relates to a fabricating method of a semiconductor light-emitting device, and more particularly to a fabricating method capable of efficiently providing a semiconductor light-emitting device having performance higher than a prescribed standard at low costs.

2. Description of the Background Art

In Japanese Patent Laying-Open No. 07-050331, a wafer includes a multi-layered semiconductor film epitaxially grown on a substrate and containing an active layer (light-emitting layer), and then an optical pulse is injected from a surface of the wafer into the active layer. An attenuation time of light emission from the active layer excited by the optical pulse is measured to determine a lifetime of minor carriers which dominantly influences luminous efficiency, in order to evaluate the luminous efficiency of light-emitting devices formed from the wafer.

In the case of a light-emitting device including a multi-layered semiconductor film made of a plurality of nitride-based compound semiconductor layers, for example, it is likely that piezoelectric field is generated in the active layer due to large internal strain in the multi-layered semiconductor film. In such a case, the energy band in the active layer suffers bending, which influences and changes the lifetime of the minor carriers. As such, the luminous efficiency cannot precisely be evaluated by using the method disclosed in Japanese Patent Laying-Open No. 07-050331.

SUMMARY OF THE INVENTION

In view of the foregoing, an object of the present invention is to provide a method with which a semiconductor light-emitting device having performance higher than a prescribed standard can efficiently be fabricated at low costs.

A fabricating method of a semiconductor light-emitting device according to the present invention includes the steps of forming a wafer including a multi-layered semiconductor film epitaxially grown on a base substrate and containing an active layer; performing pass/fail judgment of the active layer by photo-exciting the active layer in the wafer and then measuring intensity of light emission from the active layer at least at two temperature points; and forming a light-emitting device structure with the multi-layered semiconductor film containing the active layer judged to be of good quality in the pass/fail judgment.

The step of performing pass/fail judgment of the active layer may be carried out before or during the step of forming the light-emitting device structure. It is preferable that light of a wavelength that can selectively excite the active layer is used for the photo-excitation. Further, it is preferable that among the at least two temperature points, the lowest temperature point is in a range of lower than 150K and the highest temperature point is in a range of higher than 230 K and lower than 550 K. Density of carriers generated in the active layer by the photo-excitation is preferably in a range of more than 1/100 and less than 100 times a carrier density in the semiconductor light-emitting device that is under a condition of being injected with a rated current density. The pass/fail judgment of the active layer can be carried out based on whether a ratio of the emission intensity at a temperature point of higher than 230 K and lower than 550 K to that at a temperature point of lower than 150 K is greater than a prescribed reference value.

The step of forming the light-emitting device structure may include the step of bonding the wafer to a support substrate, and the step of performing pass/fail judgment of the active layer may be carried out after the bonding step. The step of forming the light-emitting device structure may include the step of removing the base substrate, and the step of performing pass/fail judgment of the active layer may be carried out after the removing step.

A semiconductor light-emitting device fabricated by the above-described method may include a layer of nitride-based compound semiconductor ($In_xAl_yGa_{1-x-y}N$: $0 \leq x$, $0 \leq y$, $x+y<1$) in the multi-layered semiconductor film.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a flowchart illustrating steps in a fabricating method of a light-emitting device according to first through third embodiments of the present invention.

FIG. 2 is a schematic cross sectional view showing a wafer including a multi-layered semiconductor film which is formed on a sapphire substrate (base substrate) and contains an active layer.

FIG. 3 is a schematic cross sectional view showing a plurality of metal or alloy layers formed on the multi-layered semiconductor film shown in FIG. 2.

FIG. 4 is a schematic cross sectional view showing a plurality of metal layers formed on both main surfaces of a Si substrate (support substrate).

FIG. 5 is a graph showing an emission spectrum as a result of photoluminescence measurement of a light-emitting layer at a low temperature.

FIG. 6 is a graph showing an emission spectrum as a result of photoluminescence measurement of a light-emitting layer at a room temperature.

FIG. 7 is a graph showing the relation between the measured internal quantum efficiency of the light-emitting layer and the optical output of the light-emitting device in the first embodiment.

FIG. 8 is a graph showing the relation between the measured lifetime of carriers in the light-emitting layer of the first embodiment determined by a conventional measurement method and the optical output of the light-emitting device.

FIG. 9 is a schematic block diagram showing an example of a photoluminescence measurement apparatus.

DESCRIPTION OF THE PREFERRED EMBODIMENTS

As described above, when emission intensity caused by photo-excitation in an active layer is measured at least at two temperature points, luminous efficiency of the active layer can precisely be evaluated for pass/fail judgment of the active layer.

The luminous efficiency measured herein is so-called internal quantum efficiency of the active layer. The internal quantum efficiency means the ratio of electric current that is converted into light to the total current injected into the active layer. When the epitaxial growth conditions for the multi-layered semiconductor film vary and then the crystal quality varies, the internal quantum efficiency of the active layer also varies.

It is known that the internal quantum efficiency is 100% at a low temperature. This means that the ratio of the emission intensity of the active layer at a room temperature to that at the low temperature indicates the internal quantum efficiency at the room temperature. In the method of the present invention, the internal quantum efficiency of the active layer can precisely be measured, since it is not affected by bending of the energy band due to the piezoelectric field in the multi-layered semiconductor film. According to the present invention, therefore, it is possible to provide a method that can efficiently fabricate a light-emitting device having performance higher than a prescribed standard at low costs.

First Embodiment

A flowchart in FIG. 1 shows steps in the fabricating method of a nitride-based semiconductor light-emitting device according to a first embodiment of the present invention.

In the first embodiment, firstly in a step P1, a sapphire substrate (base substrate) is subjected to pretreatment using an acid, though this pretreatment of the substrate may be omitted.

In a step P2, as shown in a schematic cross sectional view of FIG. 2, a multi-layered semiconductor film including a plurality of semiconductor layers 2-7 is formed on a sapphire substrate 1 by MOCVD (metallorganic chemical vapor deposition) (light-emitting device growth step). At this time, sapphire substrate 1 is initially introduced into a reaction chamber of a MOCVD apparatus. Substrate 1 is heated to 1100° C. in a hydrogen atmosphere and held at the same temperature for several minutes for cleaning thereof.

Thereafter, the substrate temperature is decreased to 1050° C., and $NH_3$ is introduced into the reaction chamber. Subsequently, TMG (trimethyl gallium) and TMA (trimethyl aluminum) are introduced into the reaction chamber to grow an AlGaN layer 2 to about 0.2 μm thickness. Next, $SiH_4$ is let flow into the reaction chamber for several minutes, and an n-type GaN layer 3 is grown to about 5 μm thickness.

Thereafter, the substrate temperature is lowered to 900° C., and ten InGaN layers and ten GaN layers are grown alternately to constitute a strain relaxation layer 4. The bandgap of the InGaN layers at this time is set greater than that of a light-emitting layer (active layer) 5.

Next, the substrate temperature is lowered to 780° C., and three InGaN layers and three GaN layers are grown alternately to constitute a MQW (multi-quantum well) light-emitting layer 5. In this MQW, the three InGaN layers (well layers) are made to be about 6 nm thick in total. Here, emission wavelength of light-emitting layer 5 was set to be 450 nm.

Next, the substrate temperature is increased to 980° C., and a p-type AlGaN layer 6 is grown to about 20 nm thickness and then a p-type GaN layer 7 is grown to about 100 nm thickness. Thereafter, $N_2$ and $NH_3$ alone are let flow as a gaseous atmosphere in the reaction chamber, while the substrate is cooled to a room temperature. At this time, the $NH_3$ concentration is set to be about 0.2%. The light-emitting device growth step P2 is thus completed.

In a step P3, the wafer taken out of the MOCVD apparatus in step P2 is introduced into a cryostat in order to perform photoluminescence measurement to determine the internal quantum efficiency of light-emitting layer 5. As a photoluminescence measurement apparatus, it is possible to use such an apparatus as shown in the schematic block diagram in FIG. 9, for example.

In the first embodiment, a laser device that emits light of 405 nm wavelength is used for an excitation light source 21 shown in FIG. 9. For this laser device 21, for example, it is possible to use a semiconductor laser or the second harmonic component of a solid-state laser. It is also possible to spectroscopically split a white light source and then use only light near 405 nm wavelength. When the excitation light of 405 nm wavelength is used, the light-emitting layer can selectively be excited without excitation of the semiconductor layers other than the light-emitting layer. This enables accurate evaluation of the internal quantum efficiency of the light-emitting layer without influence of the other semiconductor layers. It is noted that when a white light source is used for excitation light source 21, a spectroscope may be inserted between the white light source and a mirror 22.

The carrier density caused by photo-excitation in the light-emitting layer is set to be preferably in a range of more than 1/100 and less than 100 times, and more preferably approximately equal to, the carrier density in the light-emitting device that is under condition of being injected with a rated current density. In the first embodiment, power of the laser light of 405 nm wavelength was set to be 10 mW on the wafer surface, and the converged light spot size of the laser light on the wafer surface was set to be about 25 μm. That is, an excitation light ray 23 emitted from light source 21 and reflected by mirror 22 passes through a half mirror 24 and is converged onto an epitaxial wafer 26 by a lens 25. Provided that the light absorption coefficient of InGaN is about $1 \times 10^5$/cm for light of 405 nm wavelength, if all photons absorbed by the quantum well layers of 6 nm total thickness in the light-emitting layer generate carriers, a carrier density similar as in the case that a rated current of 20 mA is let flow through the light-emitting diode can be caused in the light-emitting layer.

Light emission 27 caused by photo-excitation of the light-emitting layer included within epitaxial wafer 26 is detected by a CCD (charge coupled device) spectroscope 28 via lens 25 and half mirror 24, and its emission intensity is measured.

In FIG. 9, CCD spectroscope 28, a cryostat 29 and an electromotive stage 30 are controlled by a personal computer 31. Cryostat 29 is sufficiently evacuated before cooling and then cooled to about 20 K.

A schematic graph in FIG. 5 shows an emission spectrum of the light-emitting layer measured at 20 K. In the graph of FIG. 5, a horizontal axis represents the emission wavelength, and a vertical axis represents the emission intensity.

Next, the set temperature of cryostat 29 is changed to 300 K. When the temperature of cryostat 29 becomes stable at 300 K, the conditions other than the temperature are set to be the same as those in the case of measurement at 20 K and then emission intensity from the light-emitting layer is measured.

A schematic graph in FIG. 6 shows an emission spectrum of the light-emitting layer measured at 300 K. In the graph of FIG. 6 as well, a horizontal axis represents the emission wavelength, and a vertical axis represents the emission intensity.

When the temperature is changed to 300 K, there may be a case where the position of wafer 26 is moved due to thermal expansion of electromotive stage 30, depending on performance of cryostat 29, in which case measurement at the same position as in the case of measurement at 20 K cannot be ensured. In such a case, a reference point may be provided in the wafer, and the position can be designated with X and Y coordinates from the reference point to enable measurement at exactly the same position. Further, there may be a case where wafer 26 moves in a direction deviated away from the focus of lens 25. In such a case, focusing may be adjusted such that the emission intensity becomes a maximum after stabilization of the temperature. This can ensure measurement of emission intensity at exactly the same position. The emission intensities due to photo-excitation in the light-emitting layer can thus be measured at the temperatures of 20 K and 300 K under the same conditions, and the internal quantum efficiency can be determined from the ratio of the intensities.

It is noted that the internal quantum efficiency may be determined as a ratio of an integrated area S2 of spectral distribution in FIG. 6 to an integrated area S1 of spectral distribution in FIG. 5. That is, the internal quantum efficiency=S2/S1. As an easier way, the internal quantum efficiency may be determined as a ratio of the peak intensity P2 of the spectral distribution in FIG. 6 to the peak intensity P1 of the spectral distribution in FIG. 5. That is, the internal quantum efficiency=P2/P1. Any wafer in which the internal quantum efficiency thus determined is more than 50% is judged to have good quality, which is then advanced to subsequent steps so as to be processed into light-emitting devices. More specifically, the wafer judged to be a good product is subjected to a step P4.

It is noted that a photo-diode may be used instead of CCD spectroscope 28 for measuring the emission intensity. In this case, although the spectral distribution and peak wavelength cannot be measured, it is possible to easily measure the emission intensity in total over each entire spectrum (i.e., each of areas S1 and S2 of the spectral distributions).

In step P4, as shown in a schematic cross sectional view of FIG. 3, a Pd electrode 8 is formed by evaporation on p-type GaN layer 7 shown in FIG. 2, and then a highly reflective AgNd electrode 9 is formed by evaporation. These electrodes are sintered by heat treatment, and then a metallic bonding layer 10 of a eutectic AuSn is formed by evaporation.

Next, in a wafer bonding step P5, as shown in the schematic cross sectional view of FIG. 4, an Si substrate (support substrate) 11 is prepared, and an Au layer 12 for eutectic bonding is formed by evaporation on one main surface, and a Ti layer 13 and an Al layer 14 are laminated by evaporation on the other main surface. Next, AuSn layer 10 on sapphire substrate 1 and Au layer 12 on Si substrate 11 are contacted face to face, which are then introduced into a wafer bonding apparatus and heated to the eutectic temperature of AuSn to perform wafer bonding. Next, in a substrate removal step P7, laser light is applied from the sapphire substrate side to remove sapphire substrate 1 and expose n-type semiconductor layer 3. The exposed surface of semiconductor layer 3 is subjected to dry etching to intentionally form an uneven texture on the surface. Next, in an electrode formation step P9, an electrode is formed on n-type semiconductor layer 3. In a chip division step P10, laser scribing is used in chip division for each light-emitting device.

Next, in a chip-screening step P11, chip-screening is carried out with a chip-screening machine. In chip-screening, electric current is injected into each chip by probing in order to measure luminance of the chip. Chips are screened depending on their measured luminance and electric properties, and defective products are eliminated. Next, the chip judged to be of good quality is mounted to a lead frame (step P12) and subjected to resin molding (step P13).

The relation between the optical output and the internal quantum efficiency was investigated in the light-emitting devices fabricated as above and it has been found that there is a very good interrelation therebetween, as shown in a graph of FIG. 7. In the graph of FIG. 7, a horizontal axis represents the internal quantum efficiency (%), and a vertical axis represents the optical output (mW).

When the internal quantum efficiency was evaluated at the time point when the crystal growth of the multi-layered semiconductor film was finished and only the wafers judged to be of good quality were advanced to the subsequent steps as described above, the fabrication time per chip was reduced by about 20% compared to the case of not conducting the evaluation step. This means that the fabricating method of the present invention can contribute to improvement in productivity as well as cost cutting of the light-emitting device.

When the relation between the optical output and the results measured by using the method of Japanese Patent Laying-Open No. 07-050331 was investigated, no correlation was recognized therebetween, as shown in a graph of FIG. 8. This means that the method of the prior art cannot be used as an appropriate inspection method. Here, in the graph of FIG. 8, a horizontal axis represents the lifetime τ (ns) of carriers, and a vertical axis represents the optical output (mW).

Second Embodiment

The steps in the fabricating method according to a second embodiment of the present invention are also shown in the flowchart in FIG. 1. The fabricating method of the second embodiment is generally similar to that of the first embodiment, except for the following points.

The second embodiment differs from the first embodiment only in that a photoluminescence measurement step P6 is additionally carried out after wafer bonding step P5, for pass/fail judgment of the active layer. This is done for the purpose of checking whether there was caused no damage to the active layer in wafer bonding step P5. The method for the pass/fail judgment is identical to that of the first embodiment. Any product of which internal quantum efficiency is more than 50% is advanced to the subsequent steps. In the second embodiment, the fabrication time per chip was reduced by about 15% compared to the case of not conducting the pass/fail judgment steps. In this manner, it was possible to improve the productivity and cut the costs in the second embodiment as well.

Although the internal quantum efficiency is checked twice in steps P3 and P6 in the second embodiment, step P3 may be omitted. In such a case, although the steps up to step P5 are carried out for all the wafers including defective ones, the inspection time in step P3 is unnecessary and thus the chip fabrication time may be reduced as a whole.

Third Embodiment

The steps in the fabricating method according to a third embodiment of the present invention are also shown in the flowchart in FIG. 1. The fabricating method of the third embodiment is again generally similar to that of the first embodiment, except for the following points.

The third embodiment differs from the first embodiment only in that a photoluminescence measurement step P8 is additionally carried out after substrate peeling step P7, for pass/fail judgment of the active layer. This is done for the purpose of checking whether there was caused no damage to the active layer in substrate removal step P7. The method for the pass/fail judgment is identical to that in the first embodiment. Any product of which internal quantum efficiency is more than 50% is judged to be of good quality and advanced to the subsequent steps. In the third embodiment, the fabrication time per chip was reduced by about 10% compared to the case of not conducting the pass/fail judgment step. Accordingly, it was possible to improve the productivity and cut the costs in the third embodiment as well.

Although the internal quantum efficiency is checked twice in steps P3 and P8 in the third embodiment, step P3 may be omitted. In such a case, although the steps up to step P7 are carried out for the wafers including defective ones, the inspection time in step P3 is unnecessary and thus the chip fabrication time may be reduced as a whole.

As described above, according to the present invention, it is possible to provide a method that can efficiently fabricate a light-emitting device having performance higher than a prescribed standard at low costs.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A fabricating method of a semiconductor light-emitting device, comprising the steps of:
    forming a wafer including a multi-layered semiconductor film epitaxially grown on a base substrate and containing an active layer;
    performing pass/fail judgment of said active layer by photo-exciting said active layer in said wafer and by measuring emission intensity from the active layer at least at two temperature points; and
    forming a light-emitting device structure with said multi-layered semiconductor film containing said active layer judged to be of good quality in said pass/fail judgment.

2. The fabricating method of a semiconductor light-emitting device according to claim 1, wherein said step of performing pass/fail judgment of said active layer is carried out before or during said step of forming the light-emitting device structure.

3. The fabricating method of a semiconductor light-emitting device according to claim 1, wherein light of a wavelength that can selectively excite said active layer is used for said photo-excitation.

4. The fabricating method of a semiconductor light-emitting device according to claim 1, wherein among said at least two temperature points, the lowest temperature point is in a range of lower than 150K and the highest temperature point is in a range of higher than 230 K and lower than 550 K.

5. The fabricating method of a semiconductor light-emitting device according to claim 1, wherein a density of carriers caused in said active layer by said photo-excitation is in a range of more than 1/100 and less than 100 times a carrier density of said semiconductor light-emitting device that is under a condition of being injected with a rated current density.

6. The fabricating method of a semiconductor light-emitting device according to claim 1, wherein said pass/fail judgment is carried out based on whether a ratio of said emission intensity at a temperature point of higher than 230 K and lower than 550 K to that at a temperature point of lower than 150 K is greater than a prescribed reference value.

7. The fabricating method of a semiconductor light-emitting device according to claim 1, wherein said step of forming the light-emitting device structure includes the step of bonding said wafer to a support substrate, and said step of performing pass/fail judgment of the active layer is carried out after the bonding step.

8. The fabricating method of a semiconductor light-emitting device according to claim 1, wherein said step of forming the light-emitting device structure includes the step of removing said base substrate, and said step of performing pass/fail judgment of the active layer is carried out after the removing step.

9. A semiconductor light-emitting device fabricated by the method recited in claim 1, wherein said multi-layered semiconductor film contains a layer of nitride-based compound semiconductor ($In_xAl_yGa_{1-x-y}N$: $0 \leq x$, $0 \leq y$, $x+y<1$).

* * * * *